US011165010B2

(12) United States Patent
Lewandowski et al.

(10) Patent No.: US 11,165,010 B2
(45) Date of Patent: Nov. 2, 2021

(54) COLD-WELDED FLIP CHIP INTERCONNECT STRUCTURE

(71) Applicant: International Business Machines Corporation, Armonk, NY (US)

(72) Inventors: Eric Peter Lewandowski, White Plains, NY (US); Jae-Woong Nah, Closter, NJ (US); Nicholas Torleiv Bronn, Long Island City, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/272,481

(22) Filed: Feb. 11, 2019

(65) Prior Publication Data

US 2020/0259064 A1 Aug. 13, 2020

(51) Int. Cl.
*H01L 39/04* (2006.01)
*H01L 23/00* (2006.01)
(Continued)

(52) U.S. Cl.
CPC ............ *H01L 39/045* (2013.01); *H01L 24/13* (2013.01); *H01L 24/16* (2013.01); *H01L 24/81* (2013.01);
(Continued)

(58) Field of Classification Search
CPC . H01L 39/045; H01L 39/025; H01L 39/2493; H01L 24/13; H01L 24/16;
(Continued)

(56) References Cited

U.S. PATENT DOCUMENTS 4,930,001 A * 5/1990 Williams ................ H01L 24/11
257/737
5,186,379 A 2/1993 Helber, Jr.
(Continued)

FOREIGN PATENT DOCUMENTS

CN 101217124 B 6/2010
CN 204375736 U 6/2015
(Continued)

OTHER PUBLICATIONS

Yorozu et al., "Sub-Kelvin single flux quantum control circuits and multi-chip packaging for supporting superconducting qubit", Journal of Physics: Conference Series, Institute of Physics Publishing, Bristol, GB, vol. 43, No. 1, Jun. 1, 2006.
(Continued)

*Primary Examiner* — Amar Movva
(74) *Attorney, Agent, or Firm* — Garg Law Firm, PLLC; Rakesh Garg; Douglas Pearson

(57) ABSTRACT

In an embodiment, a quantum device includes a first set of protrusions formed on a substrate and a second set of protrusions formed on a qubit chip. In the embodiment, the quantum device includes a set of bumps formed on an interposer, the set of bumps formed of a material having above a threshold ductility at a room temperature range, wherein a first subset of the set of bumps is configured to cold weld to the first set of protrusions and a second subset of the set of bumps is configured to cold weld to the second set of protrusions.

14 Claims, 9 Drawing Sheets

(51) Int. Cl.
*H01L 39/02* (2006.01)
*H01L 39/24* (2006.01)

(52) U.S. Cl.
CPC .......... *H01L 24/742* (2013.01); *H01L 39/025* (2013.01); *H01L 39/2493* (2013.01); *H01L 2224/13016* (2013.01); *H01L 2224/13109* (2013.01); *H01L 2224/13111* (2013.01); *H01L 2224/13113* (2013.01); *H01L 2224/13116* (2013.01); *H01L 2224/13644* (2013.01); *H01L 2224/16238* (2013.01); *H01L 2224/81895* (2013.01)

(58) Field of Classification Search
CPC .............. H01L 24/81; H01L 24/742; H01L 2224/13016; H01L 2224/13109; H01L 2224/13111; H01L 2224/13113; H01L 2224/13116; H01L 2224/13644; H01L 2224/16238; H01L 2224/81895
See application file for complete search history.

(56) References Cited

U.S. PATENT DOCUMENTS

| | | | |
|---|---|---|---|
| 5,523,628 | A | 6/1996 | Williams et al. |
| 6,891,360 | B1 | 10/1997 | Beaman et al. |
| 6,214,642 | B1 | 11/1997 | Chen et al. |
| 6,881,609 | B2 | 4/2005 | Salmon |
| 8,159,825 | B1 | 4/2012 | Dotsenko |
| 8,496,159 | B2 | 7/2013 | Feger et al. |
| 8,497,200 | B2 | 7/2013 | Matejat et al. |
| 8,921,221 | B2 | 12/2014 | McLeod et al. |
| 2009/0241337 | A1* | 10/2009 | Tanaka .................. H01R 12/52 29/879 |
| 2014/0167255 | A1 | 6/2014 | Shaue et al. |
| 2015/0091131 | A1* | 4/2015 | Lamorey ................ H01L 25/50 257/532 |
| 2016/0148965 | A1 | 5/2016 | Clayton |
| 2018/0013052 | A1* | 1/2018 | Oliver ................ H01L 25/0652 |
| 2019/0043822 | A1 | 2/2019 | Falcon et al. |
| 2019/0252536 | A1* | 8/2019 | George ................ H01L 29/423 |

FOREIGN PATENT DOCUMENTS

| | | |
|---|---|---|
| EP | 581152 B1 | 10/1997 |
| TW | 200742007 A | 11/2011 |
| WO | 1994006442 A1 | 3/1994 |
| WO | 20180212041 A1 | 11/2018 |

OTHER PUBLICATIONS

International Searching Authority, PCT/EP2020/051293, dated Apr. 8, 2020.

F. Felbier; F. Draheim; U. Goebel; H. Karstensen, Novel flip-chip interconnection technology for millimeter wave applications, 2008 58th Electronic Components and Technology Conference, Year: 2008, pp. 1978-1983.

D. Farley; T. Kahnert; K. Sinha; S. Solares; A. Dasgupta; J. F. J. Caers; X.J. Zhao, Cold welding: A new factor governing the robustness of adhesively bonded flip-chip interconnects, , 2009 59th Electronic Components and Technology Conference, Year: 2009, pp. 67-73.

* cited by examiner

COLD-WELDED FLIP CHIP INTERCONNECT STRUCTURE

TECHNICAL FIELD

The present invention relates generally to a device, a fabrication method, and fabrication system for assembly of quantum computing devices. More particularly, the present invention relates to a device, method, and system for cold-welded flip chip interconnect structures.

BACKGROUND

Hereinafter, a "Q" prefix in a word or phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented by strings comprising 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, or both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s are physically implemented by on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material (or by a geometric constriction of superconducting material). When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dissipationless nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

In a superconducting state, the material firstly offers no resistance to the passage of electrical current. When resistance falls to zero, a current can circulate inside the material without any dissipation of energy. Secondly, the material exhibits Meissner effect, i.e., provided they are sufficiently weak, external magnetic fields do not penetrate the superconductor, but remain at its surface. When one or both of these properties are no longer exhibited by the material, the material is said to be no longer superconducting.

A critical temperature of a superconducting material is a temperature at which the material begins to exhibit characteristics of superconductivity. Superconducting materials exhibit very low or zero resistivity to the flow of current. A critical field is the highest magnetic field, for a given temperature, under which a material remains superconducting.

Superconductors are generally classified into one of two types. Type I superconductors exhibit a single transition at the critical field. Type I superconductors transition from a non-superconducting state to a superconducting state when the critical field is reached. Type II superconductors include two critical fields and two transitions. At or below the lower critical field, type II superconductors exhibit a superconducting state. Above the upper critical field, type II superconductors exhibit no properties of superconductivity. Between the upper critical field and the lower critical field, type II superconductors exhibit a mixed state. In a mixed state, type II superconductors exhibit an incomplete Meissner effect, i.e., penetration of external magnetic fields in quantized packets at specific locations through the superconductor material.

The Meissner effect results from the generation of persistent currents at the surface of the superconductor material. Persistent currents are perpetual electric currents which do not require an external power source. The persistent currents generate an opposing magnetic field to cancel the external magnetic field throughout the bulk of the superconductor material. In a superconducting state, persistent currents do not decay with time due to the zero resistance property.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two computational states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any (normalized) linear combination of the two computational states is allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

The presently available quantum circuits are formed using materials that become superconducting at cryogenically low temperatures, e.g., below 10 K. The external circuits that connect to a quantum circuit usually operate at room temperature (approximately 270-300 K) or higher. The connections between an external circuit and a q-circuit, e.g., an input line to the q-circuit or an output line from the q-circuit, or both, must therefore be thermally isolated from the external circuit's environment.

To provide this thermal isolation, the lines connecting to a q-circuit pass through a series of one or more dilution fridge stages (compactly referred to herein as "stage", plural "stages"). A dilution fridge is a heat-exchange device which causes a reduction in a temperature of a component as compared to the temperature at which the component is introduced into the dilution fridge, maintains the component at a designated reduced temperature, or both. For example, a dilution fridge stage may reduce the temperature of an input line to a q-circuit and another dilution fridge stage down the line in a series of dilution fridge stages may house the q-circuit.

A signal on a line passing through a stage can contain noise. This noise can be in the microwave frequency spectrum. For the reasons described herein, microwave frequency noise is undesirable when the line and signals relate to quantum computing using q-circuits.

Flip chip assembly is a method of interconnecting an electronic device with external circuitry by metallic solder bumps deposited onto pads of the electronic device. Pads on the electronic device are aligned with matching pads on the external circuitry.

The illustrative embodiments recognize certain disadvantages with the presently available methods for quantum device assembly. For example, in the presently available methods, solder paste is deposited onto contact pads and the entire circuit assembly is then heated to create a molten state for the solder paste. Heating of the circuit assembly can be damaging to the Josephson Junction and degrade the performance of the circuit. As example, in the presently available methods, the metal deposits tend to oxidize, affecting the mechanical and electrical properties of the connection. De-oxidation of the metal deposits can be damaging to qubits. For example, chemicals and methods to remove surface oxides can be damaging and even completely destroy the Josephson Junction. Additionally, the presently available methods do not effectively create good electrical connections due to warpage of the substrate during the manufacturing process.

The illustrative embodiments recognize that solder used to form electrical connections can deform during quantum device assembly and cooling. Plastic deformation is a non-reversible change of shape of a material under applied forces. Plastic deformation, called creep, depends on the time and temperature under which the solder is exposed to a stress during assembly. The illustrative embodiments recognize that a direct relationship exists between the temperature of solder material and the amount of deformation. That is, the higher the temperature of the solder material, the more the solder deforms under an applied stress.

The illustrative embodiments further recognize that deformation of the solder during quantum device assembly affects the desired electrical connections. The illustrative embodiments recognize that solder creep changes the gap height between pads on a flip chip. The illustrative embodiments further recognize that solder creep changes the distance between the qubit and the ground and signals on the interposer. The illustrative embodiments further recognize that performance degradation occurs due to solder creep between signals, grounds, and qubits on any substrates, such as the qubit chip, interposer, or organic package. The gap height is designed to create a desired capacitance. Fluctuations in the gap height due to solder creep affects the capacitance values and the performance of the electrical connection.

SUMMARY

The illustrative embodiments provide a quantum computing device, and a method and system of fabrication therefor. In an embodiment, a quantum device includes a first set of protrusions formed on a substrate. In the embodiment, the quantum device includes a second set of protrusions formed on a qubit chip. In the embodiment, the quantum device includes a set of bumps formed on an interposer, the set of bumps formed of a material having above a threshold ductility at a room temperature range, wherein a first subset of the set of bumps is configured to cold weld to the first set of protrusions and a second subset of the set of bumps is configured to cold weld to the second set of protrusions.

In an embodiment, the first set of protrusions is of at least one member selected from a set comprising Gold and Platinum. In an embodiment, the second set of protrusions is of at least one member selected from a set comprising Gold and Platinum.

In an embodiment, the set of bumps is of at least one member selected from a set comprising Indium, Tin, Lead, and Bismuth. In an embodiment, the first set of protrusions have a conical shape. In an embodiment, the second set of protrusions have a pyramid shape.

In an embodiment, the set of bumps comprises a material exhibiting superconductivity in a cryogenic temperature range. In an embodiment, a plurality of the first set of protrusions are configured to cold weld to one of the set of bumps.

In an embodiment, a method includes forming a first set of protrusions on a substrate. In the embodiment, the method includes forming a second set of protrusions on a qubit chip. In the embodiment, the method includes forming a set of bumps formed on an interposer, the set of bumps formed of a material having above a threshold ductility at a room temperature range. In the embodiment, the method includes cold welding a subset of the set of bumps to the first set of protrusions and a second subset of the set of bumps to the second set of protrusions An embodiment includes a fabrication system for fabricating the device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
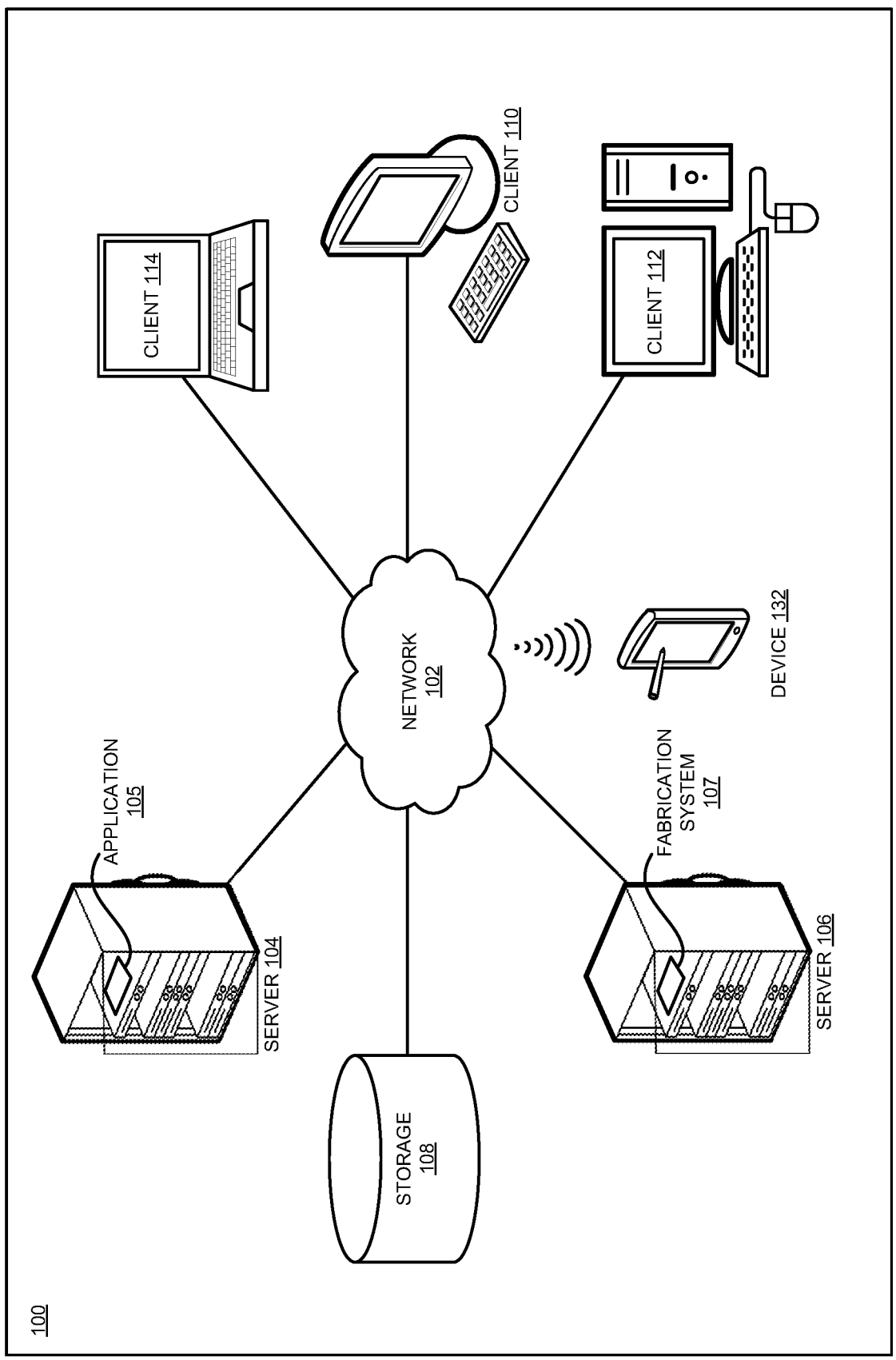
FIG. 1 depicts a block diagram of a network of data processing systems in accordance with an illustrative embodiment.

The illustrative embodiments used to describe the invention generally address and solve the above-described needs in quantum device assembly. The illustrative embodiments provide a method for quantum device assembly, which address the above-described need or problem.

An operation described herein as occurring with respect to a frequency or frequencies should be interpreted as occurring with respect to a signal of that frequency or frequencies. All references to a "signal" are references to a microwave signal unless expressly distinguished where used.

An embodiment provides a configuration of quantum computing device. Another embodiment provides a fabrication method for the quantum computing device, such that the method can be implemented as a software application. The application implementing a fabrication method embodiment can be configured to operate in conjunction with an existing fabrication system—such as a lithography system, or a circuit assembly system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example device components are used in the figures and the illustrative embodiments. In an actual fabrication or circuit, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to the figures and in particular with reference to FIG. 1, this figure is an example diagram of a data processing environment in which illustrative embodiments may be implemented. FIG. 1 is only an example and is not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a quantum device. Application 105 provides instructions to system 107 for flip chip assembly of quantum devices in a manner described herein.

The hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. In addition, the processes of the illustrative embodiments may be applied to a multiprocessor data processing system.

Figure 2:
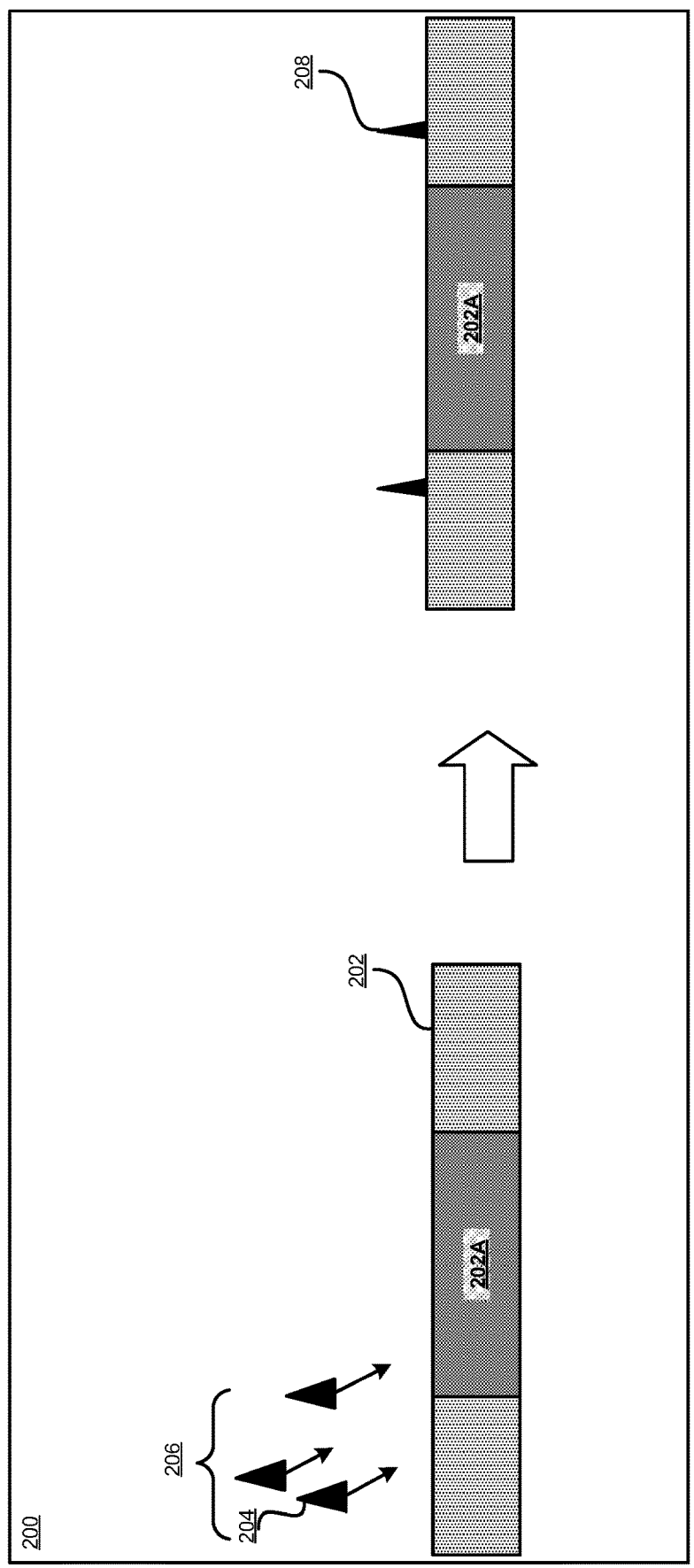
FIG. 2 depicts a block diagram of an example configuration in accordance with an illustrative embodiment.

With reference to FIG. 2, this figure depicts a block diagram of an example configuration in accordance with an illustrative embodiment. Application 105 in FIG. 1 interacts with fabrication system 107 to produce or manipulate configuration 200 as described herein.

Configuration 200 comprises substrate 202. Substrate 202 comprises a recess 202A disposed therethrough. Substrate 202 comprises a material with a predetermined thermal conductivity (above a threshold) in the cryogenic temperature range, about 77K to 0.01K. In an embodiment, substrate 202 is formed using a material that exhibits a Residual Resistance Ratio (RRR) of at least 100, and a thermal conductivity of greater than a 1 W/(cm*K) at 4 Kelvin, threshold level of thermal conductivity. RRR is the ratio of the resistivity of a material at room temperature and at 0 K. Because 0 K cannot be reached in practice, an approximation at 4 K is used. For example, substrate 202 may be an organic substrate or a ceramic substrate for operations in the cryogenic temperature range. This example of substrate material is not intended to be limiting. From this disclosure those of ordinary skill in the art will be able to conceive of many other materials suitable for forming the substrate and the same are contemplated within the scope of the illustrative embodiments.

An embodiment causes a fabrication system, such as fabrication system 107 in FIG. 1, to create a set of protrusions 208 on a surface of the substrate 202. For example, an embodiment can cause the fabrication system to deposit material 206, thus forming the set of protrusions 208. In an embodiment, fabrication system 107 comprises a wire bonder to deposit material 206 and form protrusion 208. For example, the wire bonder can form a first half of a ball bond before pulling upwards to deposit the remainder of the protrusion.

In an embodiment, protrusion 208 is a column. In another embodiment, protrusion 208 is a cone or a pyramid. For example, protrusion 208 can have an approximately triangular, cylindrical, circular, or rectangular cross-section.

In an embodiment, protrusion 208 comprises a material 204 with a predetermined ductility (above a threshold) at a room temperature range, 270 to 300K. In an embodiment, protrusion 208 is formed using a material that exhibits an elongation at break of at least twenty percent at a room temperature range, threshold level of ductility. Elongation at break is the ratio between increased length and initial length after fracture of a material in a tension test. For example, protrusion 208 may be formed using gold, platinum, or a gold-coated superconducting material. In an embodiment, protrusion 208 is formed using a material resistant to oxidation, chemical degradation of a surface of the material caused by oxygen. These examples of substrate materials, deposition devices, protrusion shapes, and protrusion materials are not intended to be limiting. From this disclosure those of ordinary skill in the art will be able to conceive of many other shapes, materials, and deposition devices suitable for forming the substrate and protrusions and the same are contemplated within the scope of the illustrative embodiments.

Figure 3:
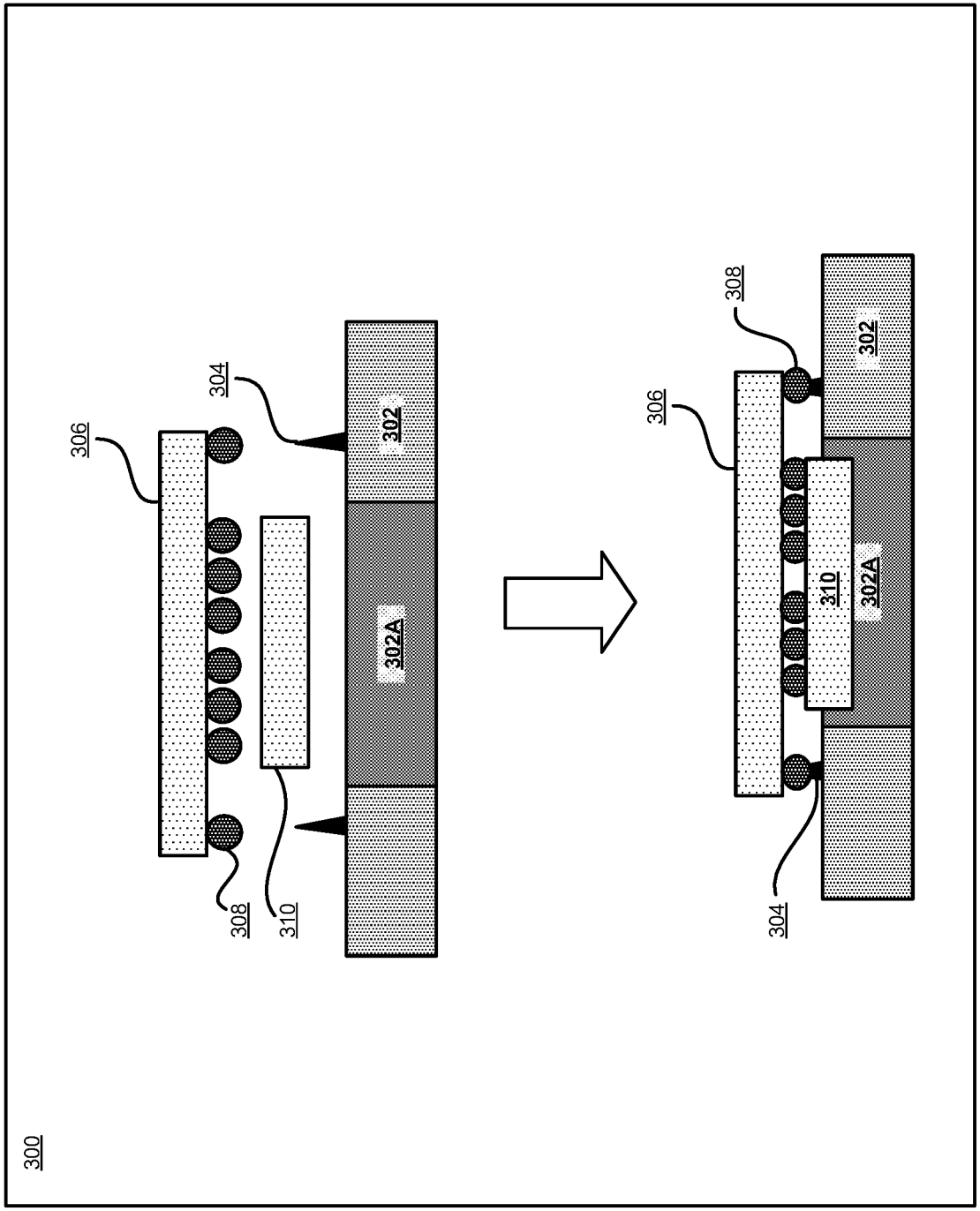
FIG. 3 depicts a block diagram of an example configuration in accordance with an illustrative embodiment.

With reference to FIG. 3, this figure depicts a block diagram of an example configuration in accordance with an illustrative embodiment. Application 105 in FIG. 1 interacts with fabrication system 107 to produce or manipulate configuration 300 as described herein.

Configuration 300 comprises substrate 302, interposer 306, and qubit chip 310. Substrate 302 is an example of substrate 202 in FIG. 2. An embodiment causes the fabrication system 107 to deposit material on the interposer 306, thus forming a set of bumps 308. For example, an embodiment can cause the fabrication system 107 to solder the set of bumps 308 on the interposer 306. As another example, the set of bumps 308 can be formed by electroplating, evaporating, ball mounting, paste printing, jetting, or injection molded soldering (IMS).

In an embodiment, the set of bumps 308 comprises a material with a predetermined ductility (above a threshold) at a room temperature range. In an embodiment, the set of bumps 308 is formed using a material that exhibits an elongation at break of at least twenty percent at a room temperature range. For example, the set of bumps 308 is formed using at least one of Indium, Tin, Lead, Bismuth, and any combination thereof.

An embodiment causes the fabrication system to couple a qubit chip 310 to interposer 306. In an embodiment, fabrication system 107 cold welds a set of pads of the qubit chip 310 with a subset of the set of solder bumps 308 on the interposer 306. In an embodiment, fabrication system 107 cold welds a second subset of the set of solder bumps 308 with a set of protrusions 304 formed on the substrate 302. Protrusion 304 is similar to protrusion 208 in FIG. 2.

In an embodiment, each protrusion 304 couples to a corresponding solder bump 308. For example, each protrusion 304 can pierce the corresponding solder bump 308. Piercing the corresponding solder bump 308 enables contact between an outer surface of the protrusion 304 and an unoxidized, inner surface of the solder bump 308. In another embodiment, multiple protrusions 304 couple to a single solder bump 308. An embodiment causes the fabrication system to cold weld the second subset of solder bumps 308 with the set of protrusions 304. Cold welding is a welding process in which coupling takes place without heating at the interface of the two parts to be welded. In cold welding, no liquid or molten phase is present. After coupling, the qubit chip 310 is disposed in a recess 302A of the substrate. These examples of deposition methods and solder bump material are not intended to be limiting. From this disclosure, those of ordinary skill in the art will be able to conceive of many other materials and methods suitable for forming the set of bumps and the same are contemplated within the scope of the illustrative embodiments.

Figure 4:
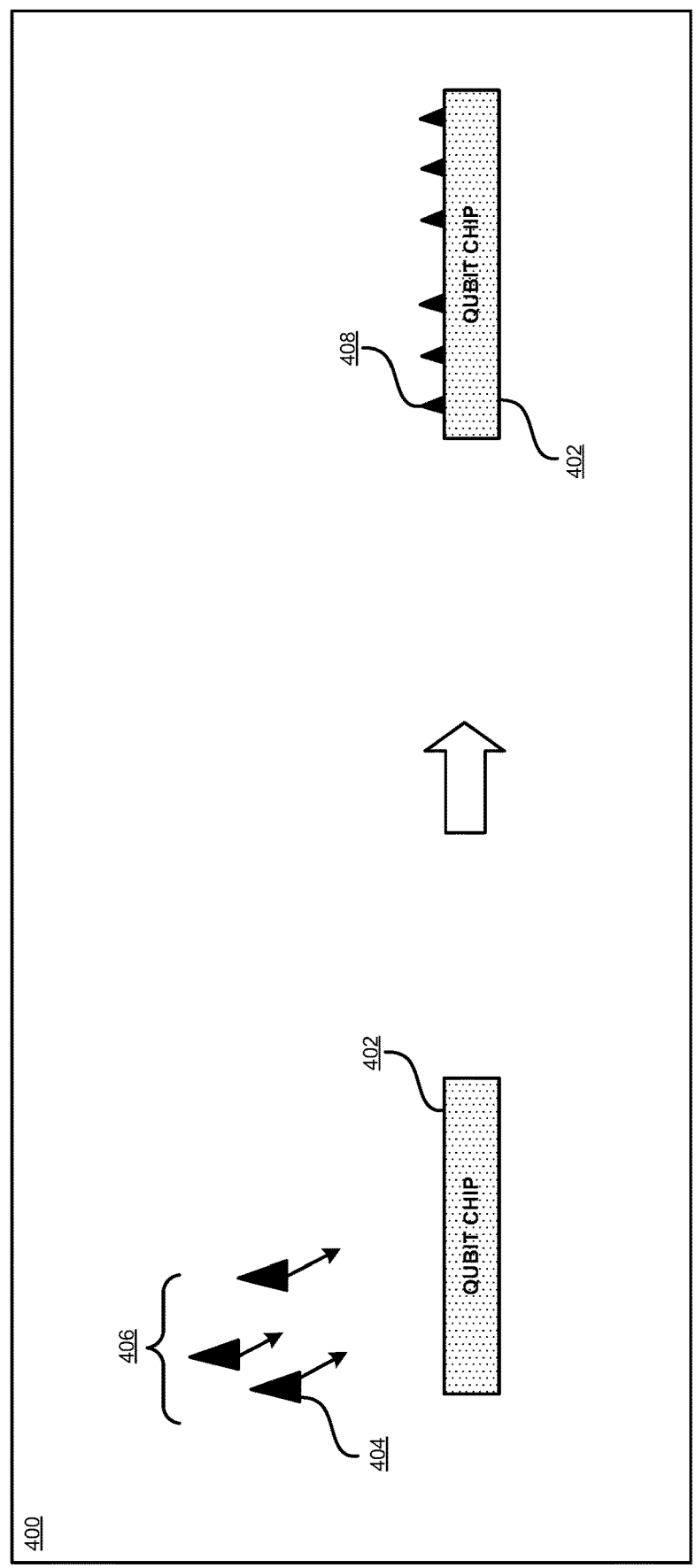
FIG. 4 depicts a block diagram of an example configuration in accordance with an illustrative embodiment.

With reference to FIG. 4, this figure depicts a block diagram of an example configuration in accordance with an illustrative embodiment. Application 105 in FIG. 1 interacts with fabrication system 107 to produce or manipulate configuration 400 as described herein.

Configuration 400 comprises qubit chip 402. Qubit chip 402 comprises a material with a predetermined thermal conductivity (above a threshold) in the cryogenic temperature range. In an embodiment, qubit chip 402 is formed using a material that exhibits a RRR of at least 100, and a thermal conductivity of greater than a 1 W/(cm*K) at 4 Kelvin, threshold level of thermal conductivity. For example, qubit chip 402 may be formed using sapphire, silicon, quartz, gallium arsenide, fused silica, amorphous silicon, or diamond for operations in the cryogenic temperature range.

An embodiment causes a fabrication system, such as fabrication system 107 in FIG. 1, to create a set of protrusions 408 on a surface of the qubit chip 402. For example, an embodiment can cause the fabrication system to deposit material 406, thus forming the set of protrusions 408. In an embodiment, fabrication system 107 comprises a wire bonder to deposit material 406 and form protrusion 408. For example, the wire bonder can form a first half of a ball bond before pulling upwards to deposit the remainder of the protrusion. In an embodiment, protrusion 408 is a column. For example, protrusion 408 can have a triangular, cylindrical, or rectangular cross-section.

In an embodiment, protrusion 408 comprises a material 404 with a predetermined ductility (above a threshold) at a room temperature range. In an embodiment, protrusion 408 is formed using a material that exhibits an elongation at break of at least twenty percent at a room temperature range. For example, protrusion 408 may be formed using gold, platinum, or a gold-coated superconducting material. These examples of protrusion material, qubit chip material, protrusion shapes, and deposition methods are not intended to be limiting. From this disclosure those of ordinary skill in the art will be able to conceive of many other materials and methods suitable for forming the substrate, qubit chip, and protrusions and the same are contemplated within the scope of the illustrative embodiments.

Figure 5:
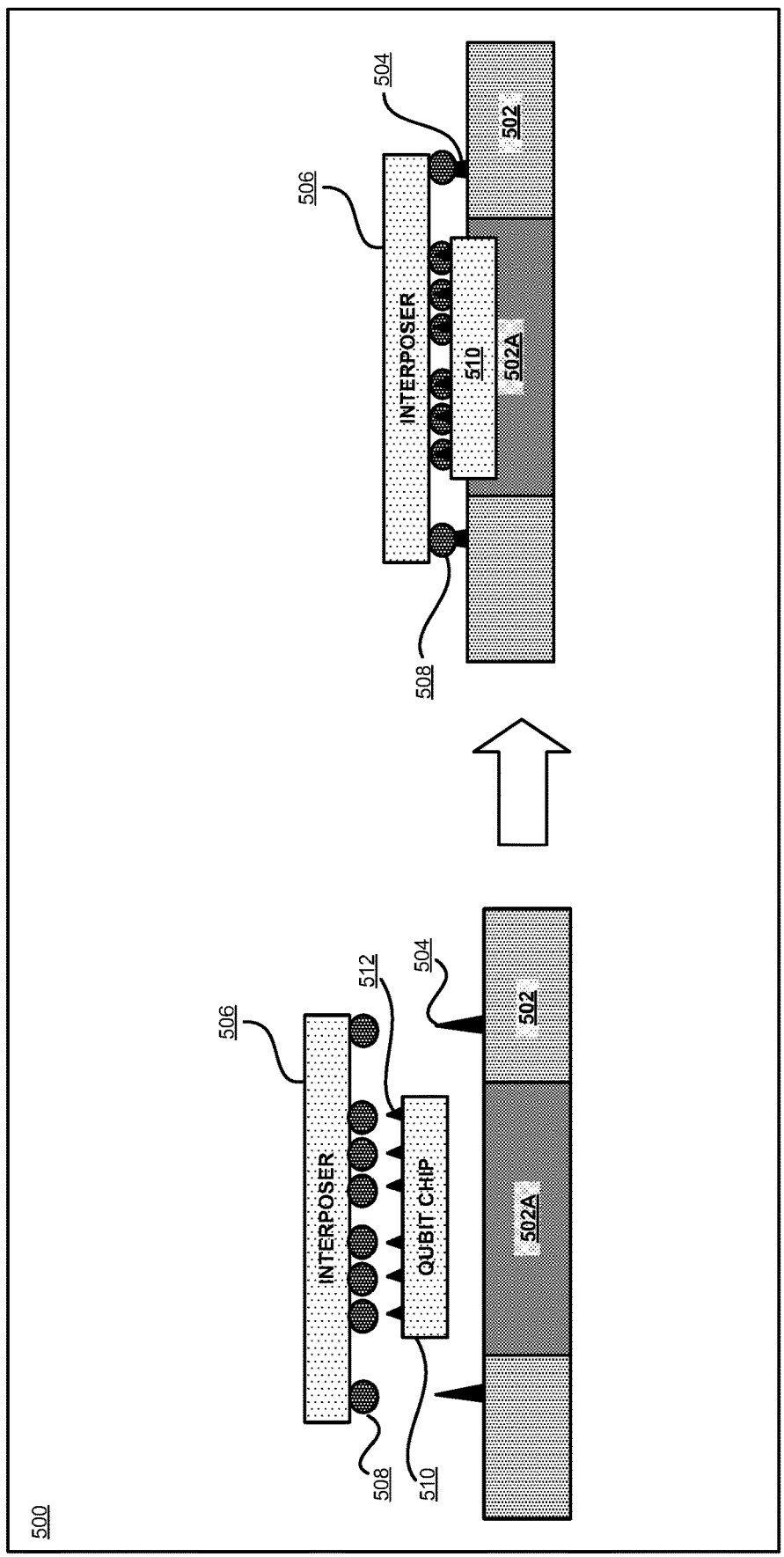
FIG. 5 depicts a block diagram of an example configuration in accordance with an illustrative embodiment.

With reference to FIG. 5, this figure depicts a block diagram of an example configuration in accordance with an illustrative embodiment. Application 105 in FIG. 1 interacts with fabrication system 107 to produce or manipulate configuration 500 as described herein.

Configuration 500 comprises substrate 502, interposer 506, and qubit chip 510. Substrate 502 is an example of substrate 202 in FIG. 2. Qubit chip 510 is an example of qubit chip 502 in FIG. 5. An embodiment causes the fabrication system 107 to deposit material on the interposer 506, thus forming a set of bumps 508. For example, an embodiment can cause the fabrication system 107 to solder the set of bumps 508 on the interposer 506. As another example, the set of bumps 508 can be formed by electroplating, evaporating, ball mounting, paste printing, jetting, or injection molded soldering (IMS).

In an embodiment, the set of bumps 508 comprises a material with a predetermined ductility (above a threshold) at a room temperature range. In an embodiment, the set of bumps 508 is formed using a material that exhibits an elongation at break of at least twenty percent at a room temperature range. For example, the set of bumps 508 is formed using at least one of Indium, Tin, Lead, Bismuth, and any combination thereof.

An embodiment causes the fabrication system to couple a qubit chip 510 to interposer 506. In an embodiment, fabrication system 107 cold welds a set of protrusions 512 of the qubit chip 510 with a subset of the set of solder bumps 508 on the interposer 506. In an embodiment, each protrusion 512 couples to a corresponding solder bump 508. For example, each protrusion 512 can pierce the corresponding solder bump 508. An embodiment causes the fabrication system to cold weld the first subset of solder bumps 508 with the set of protrusions 512. Cold welding is a welding process in which coupling takes place at the interface of the two parts to be welded, wherein the interface is at a room temperature range. In cold welding, the interface is in a solid state.

An embodiment causes the fabrication system to couple interposer 506 to substrate 502. In an embodiment, fabrication system 107 cold welds a second subset of the set of solder bumps 508 with a set of protrusions 504 formed on the substrate 502. In an embodiment, each protrusion 504 couples to a corresponding solder bump 508. For example, each protrusion 504 can pierce the corresponding solder bump 508. An embodiment causes the fabrication system to cold weld the second subset of solder bumps 508 with the set of protrusions 504. Protrusion 504 is similar to protrusion 208 in FIG. 2. After coupling the substrate 502 and interposer 506, the qubit chip 510 is disposed in a recess 502A of the substrate. These examples of deposition methods and solder bump materials are not intended to be limiting. From this disclosure, those of ordinary skill in the art will be able to conceive of many other materials and deposition methods suitable for forming the set of bumps and the same are contemplated within the scope of the illustrative embodiments.

Figure 6:
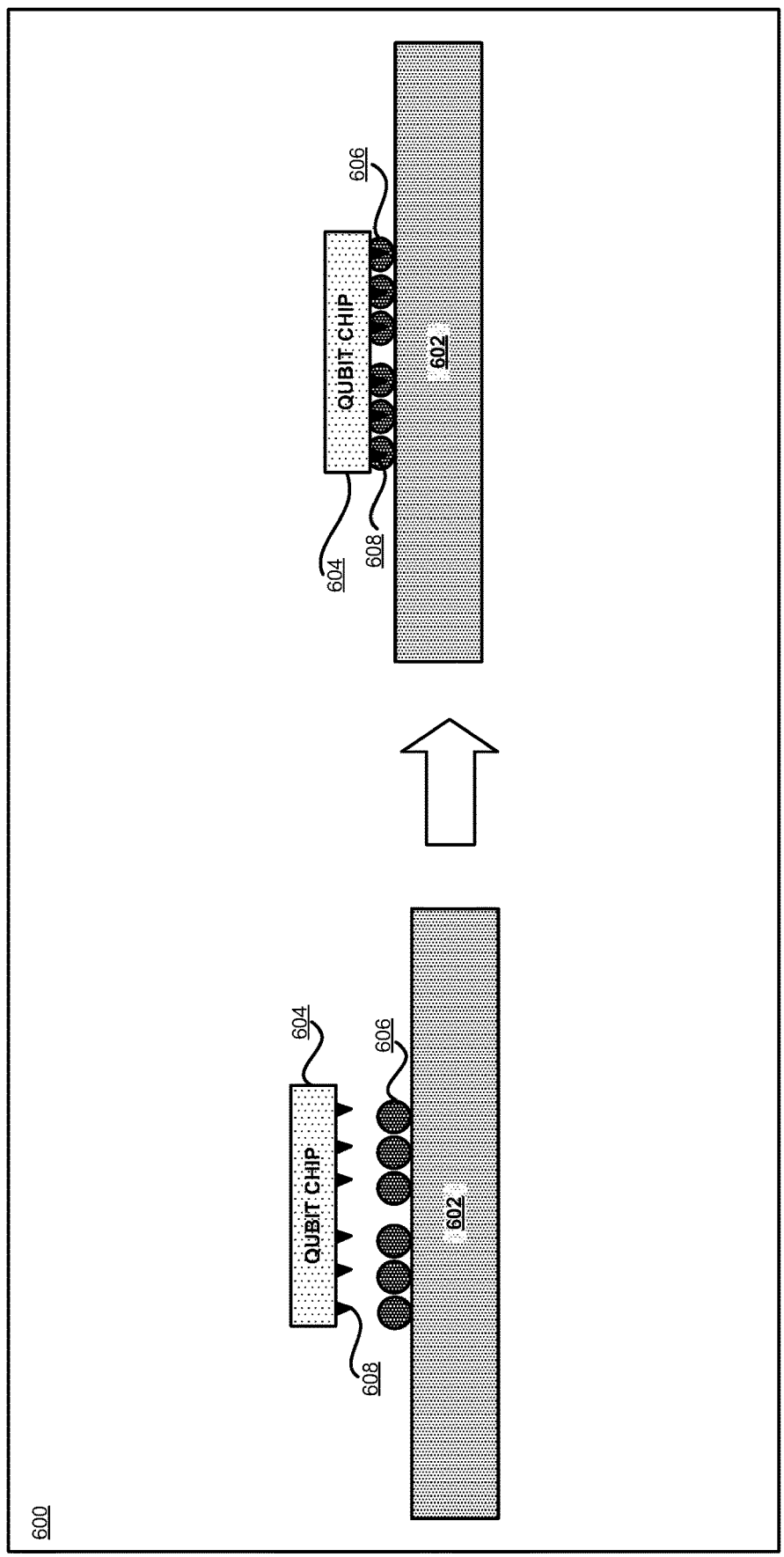
FIG. 6 depicts a block diagram of an example configuration in accordance with an illustrative embodiment.

With reference to FIG. 6, this figure depicts a block diagram of an example configuration in accordance with an illustrative embodiment. Application 105 in FIG. 1 interacts with fabrication system 107 to produce or manipulate configuration 600 as described herein.

Configuration 600 comprises substrate 602, and qubit chip 604. Substrate 602 is an example of substrate 202 in FIG. 2. Qubit chip 604 is an example of qubit chip 402 in FIG. 4. An embodiment causes fabrication system 107 to deposit material on the substrate 606, thus forming a set of bumps 606. For example, an embodiment can cause fabrication system 107 to solder the set of bumps 606 on substrate 602. As another example, the set of bumps 606 can be formed by electroplating, evaporating, ball mounting, paste printing, jetting, or injection molded soldering (IMS).

In an embodiment, the set of bumps 606 comprises a material with a predetermined ductility (above a threshold) at a room temperature range. In an embodiment, the set of bumps 606 is formed using a material that exhibits an elongation at break of at least twenty percent at a room temperature range. For example, the set of bumps 606 is formed using at least one of Indium, Tin, Lead, Bismuth, and any combination thereof.

An embodiment causes the fabrication system to couple qubit chip 604 to substrate 602. In an embodiment, fabrication system 107 cold welds a set of protrusions 608 of qubit chip 604 with the set of solder bumps 606 on substrate 602. In an embodiment, each protrusion 608 couples to a corresponding solder bump 606. For example, each protrusion 608 can pierce the corresponding solder bump 606. An embodiment causes the fabrication system to cold weld the set of solder bumps 606 with the set of protrusions 608. These examples of deposition methods and solder bump materials are not intended to be limiting. From this disclosure, those of ordinary skill in the art will be able to conceive of many other materials and deposition methods suitable for forming the set of bumps and the same are contemplated within the scope of the illustrative embodiments.

Figure 7:
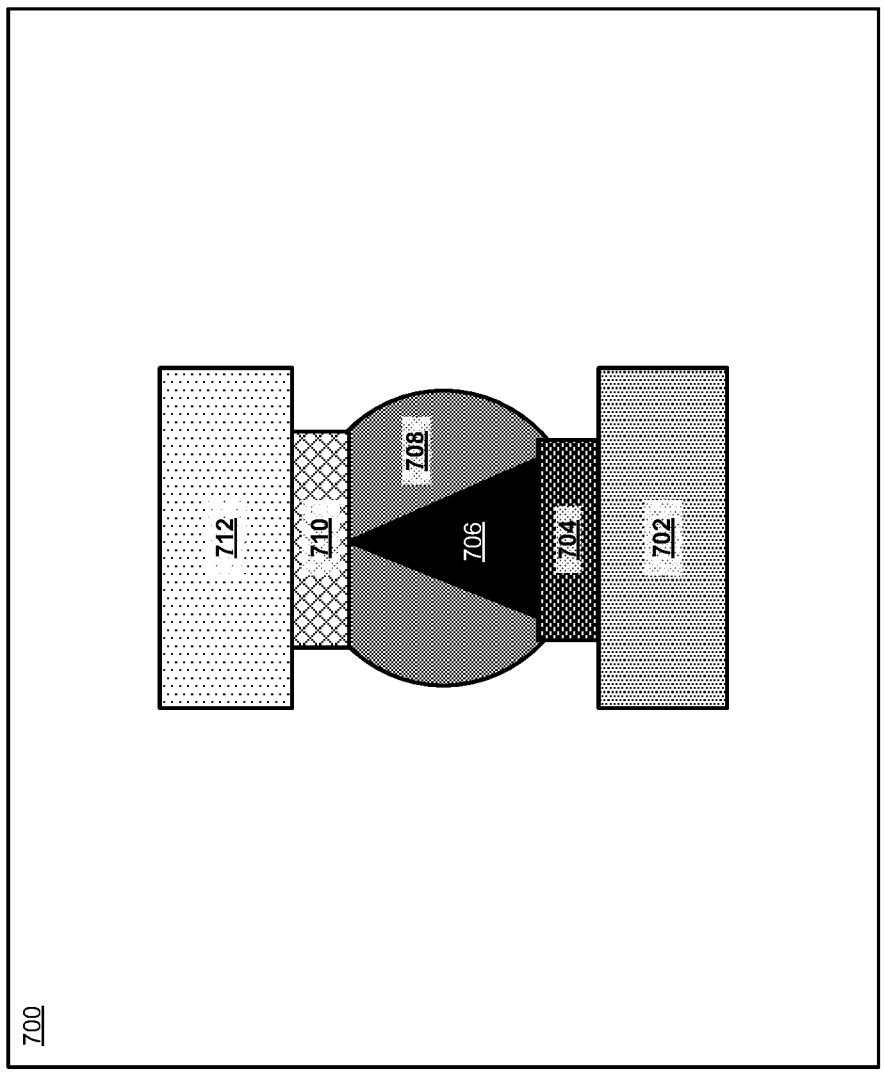
FIG. 7 depicts a block diagram of an example configuration in accordance with an illustrative embodiment.

With reference to FIG. 7, this figure depicts a block diagram of an example configuration in accordance with an illustrative embodiment. Configuration 700 is an example of the cold-welded connection between protrusion 304 and protrusion 308; protrusion 504 and protrusion 508; protrusion 512 and protrusion 508; or protrusion 606 and protrusion 608 in FIGS. 4, 5, and 6, respectively. Configuration 700 comprises first substrate 702, first pad 704, protrusion 706, bump 708, second pad 710, and second substrate 712.

Configuration 700 comprises substrate 702. Substrate 702 comprises a material with a predetermined thermal conductivity (above a threshold) in the cryogenic temperature range. In an embodiment, substrate 702 is formed using a material that exhibits a RRR of at least 100, and a thermal conductivity of greater than a 1 W/(cm*K) at 4 Kelvin, threshold level of thermal conductivity. For example, substrate 702 may be an organic substrate or a ceramic substrate for operations in the cryogenic temperature range.

Configuration 700 comprises second substrate 712. Second substrate 712 comprises a material with a predetermined thermal conductivity (above a threshold) in the cryogenic temperature range. In an embodiment, second substrate 712 is formed using a material that exhibits a RRR of at least 100, and a thermal conductivity of greater than a 1 W/(cm*K) at 4 Kelvin, threshold level of thermal conductivity. For example, second substrate 712 may be formed using sapphire, silicon, quartz, gallium arsenide, fused silica, amorphous silicon, or diamond for operations in the cryogenic temperature range.

In an embodiment, first pad 704 and second pad 710 is formed using at least one of titanium, palladium, gold, silver, copper, or platinum for operations in the cryogenic temperature range. In an embodiment, first pad 704 and second pad 710 are deposited as under bump metallurgy (UBM) by using sputtering, evaporation, or plating method.

Protrusion 706 is an example of protrusion 208 in FIG. 2. Bump 708 is an example of bump 408 in FIG. 4. An embodiment causes the fabrication system to couple first substrate 702 to second substrate 712. In an embodiment, fabrication system 107 cold welds the protrusion 706 of the first substrate 702 with a solder bump 708 on the second substrate 712. For example, protrusion 706 can pierce the corresponding solder bump 708. An embodiment causes the fabrication system to cold weld the solder bump 708 with the protrusion 706.

In an embodiment, the bump 708 comprises a material with a predetermined ductility (above a threshold) at a room temperature range. In an embodiment, the bump 708 is formed using a material that exhibits an elongation at break of at least twenty percent at a room temperature range. For example, the bump 708 is formed using at least one of Indium, Tin, Lead, Bismuth, and any combination thereof.

In an embodiment, the bump 708 comprises a material which exhibits superconductivity in the cryogenic temperature range. In an embodiment, the bump 708 is formed using a material that exhibits superconductivity in the cryogenic temperature range. For example, the set of bumps 408 is formed using at least one of Indium, Tin, Bismuth, Lead, and any combination thereof. In an embodiment, bump 708 contacts first pad 704 and second pad 710. In an embodiment, bump 708 provides a superconducting path between first pad 704 and second pad 710 in the cryogenic temperature range. These examples of substrate materials, bump materials, deposition methods, and pad materials are not intended to be limiting. From this disclosure those of ordinary skill in the art will be able to conceive of many other materials and deposition methods suitable for forming the components of the device and the same are contemplated within the scope of the illustrative embodiments.

Figure 8:
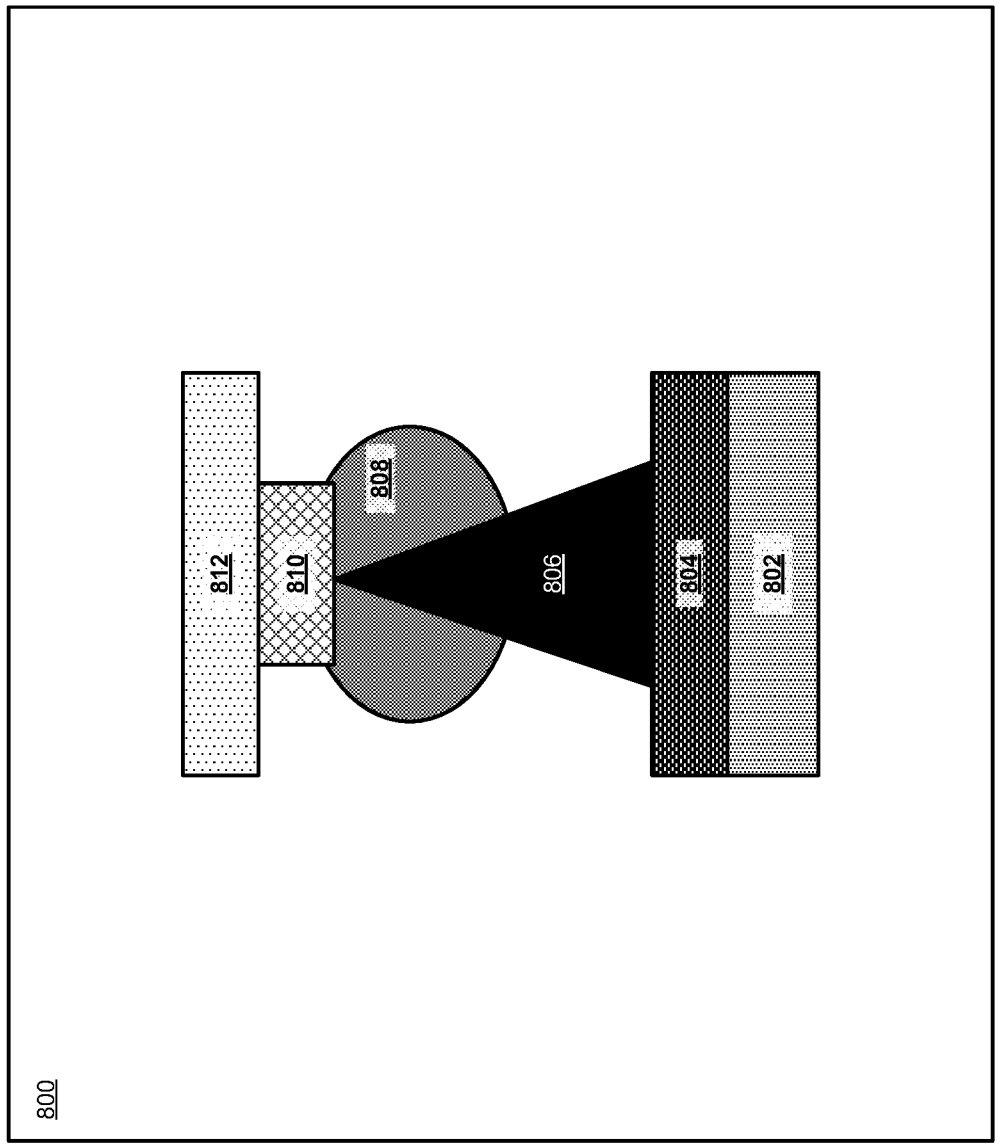
FIG. 8 depicts a block diagram of an example configuration in accordance with an illustrative embodiment.

With reference to FIG. 8, this figure depicts a block diagram of an example configuration in accordance with an illustrative embodiment. Configuration 800 is an example of the cold-welded connection between protrusion 304 and protrusion 308; protrusion 504 and protrusion 508; protrusion 512 and protrusion 508; or protrusion 606 and protrusion 608 in FIGS. 4, 5, and 6, respectively. Configuration 800 comprises first substrate 802, first pad 804, protrusion 806, bump 808, second pad 810, and second substrate 812.

Configuration 800 comprises substrate 802. Substrate 802 comprises a material with a predetermined thermal conductivity (above a threshold) in the cryogenic temperature range. In an embodiment, substrate 802 is formed using a material that exhibits a RRR of at least 100, and a thermal conductivity of greater than a 1 W/(cm*K) at 4 Kelvin, threshold level of thermal conductivity. For example, substrate 802 may be an organic substrate or a ceramic substrate for operations in the cryogenic temperature range.

Configuration 800 comprises second substrate 812. Second substrate 812 comprises a material with a predetermined thermal conductivity (above a threshold) in the cryogenic temperature range. In an embodiment, second substrate 812 is formed using a material that exhibits a RRR of at least 100, and a thermal conductivity of greater than a 1 W/(cm*K) at 4 Kelvin, threshold level of thermal conductivity. For example, second substrate 812 may be formed using sapphire, silicon, quartz, gallium arsenide, fused silica, amorphous silicon, or diamond for operations in the cryogenic temperature range.

In an embodiment, first pad 804 and second pad 810 is formed using at least one of titanium, palladium, gold, silver, copper, or platinum for operations in the cryogenic temperature range. These examples of pad materials are not intended to be limiting. From this disclosure those of ordinary skill in the art will be able to conceive of many other materials suitable for forming the first layer and the same are contemplated within the scope of the illustrative embodiments. In an embodiment, first pad 804 and second pad 810 are deposited as under bump metallurgy (UBM) by using sputtering, evaporation, or plating method.

Protrusion 806 is an example of protrusion 208 in FIG. 2. Bump 808 is an example of bump 408 in FIG. 4. An embodiment causes the fabrication system to couple first substrate 802 to second substrate 812. In an embodiment, fabrication system 107 cold welds the protrusion 806 of the first substrate 802 with a solder bump 808 on the second substrate 812. For example, protrusion 806 can pierce the corresponding solder bump 808. An embodiment causes the fabrication system to cold weld the solder bump 808 with the protrusion 806.

In an embodiment, the bump 808 comprises a material with a predetermined ductility (above a threshold) at a room temperature range. In an embodiment, the bump 808 is formed using a material that exhibits an elongation at break of at least twenty percent at a room temperature range. For example, the bump 808 is formed using at least one of Indium, Tin, Lead, Bismuth, and any combination thereof.

In an embodiment, a capacitance of the electrical connection is determined by a distance between the first pad 804 and the second pad 810. For example, the capacitance is inversely proportional to a distance, or gap height, between the first pad 804 and the second pad 810. In an embodiment, protrusion 806 has a height corresponding to a desired capacitance of the electrical connection. In an embodiment, the gap height is a function of the height of the protrusion 806 and the compression force during cold welding. For example, the gap height can have an inverse relationship with the amount of the compression force during cold welding. As another example, the gap height can have a direct relationship with the height of the protrusion 806. These examples of substrate materials, bump materials, deposition methods, and pad materials are not intended to be limiting. From this disclosure those of ordinary skill in the art will be able to conceive of many other materials and deposition methods suitable for forming the components of the device and the same are contemplated within the scope of the illustrative embodiments. In an embodiment, a height of corresponding protrusions differs between a set of protrusions formed on a surface. For example, a height of protrusions can differ to accommodate warpage of a substrate.

Figure 9:
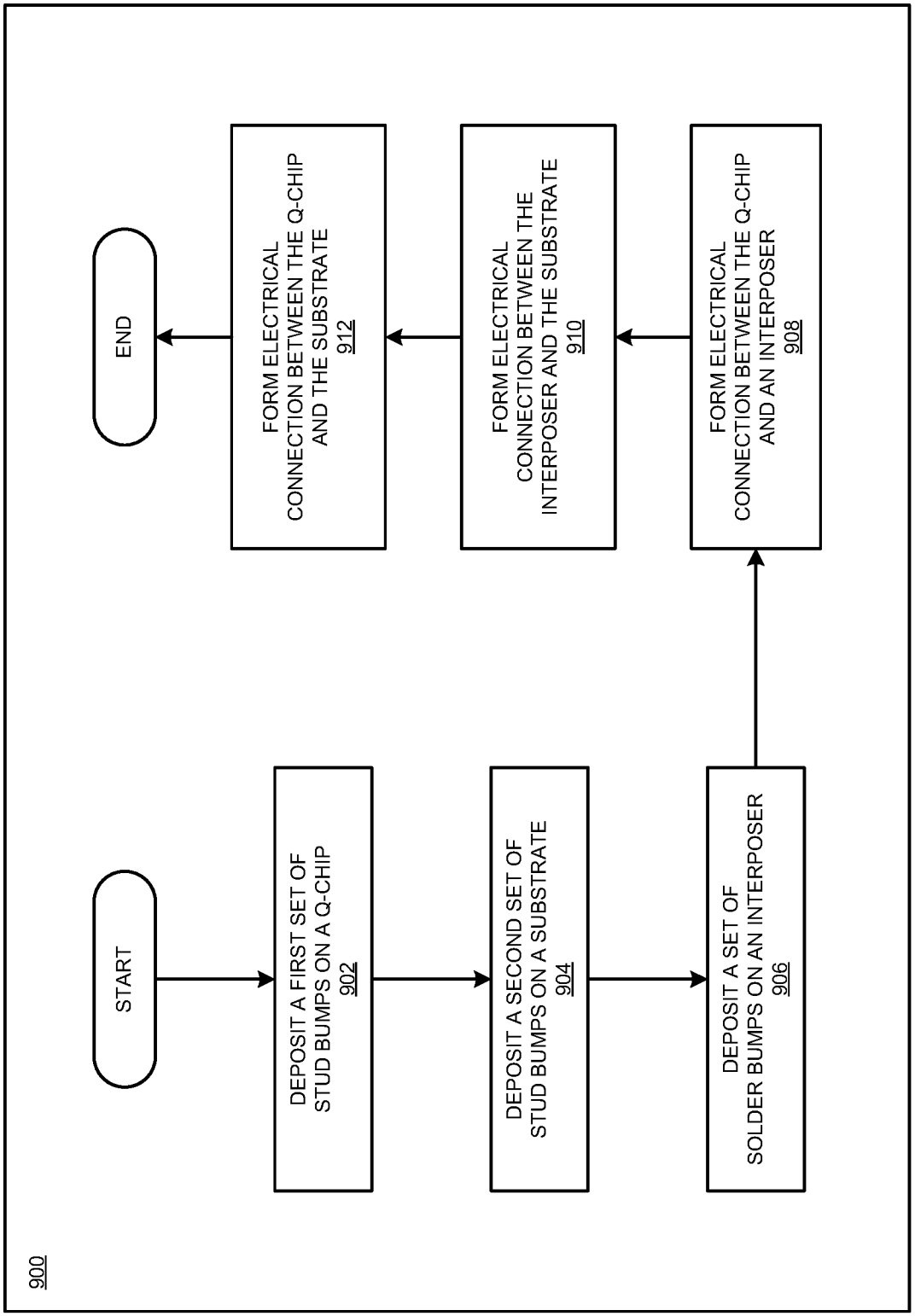
FIG. 9 depicts a flowchart of a quantum device assembly process in accordance with an illustrative embodiment.

With respect to FIG. 9, this figure depicts a flowchart of a quantum device assembly process in accordance with an illustrative embodiment. Process 900 can be implemented in application 105 in FIG. 1, to cold weld an electrical connection as described with respect to FIGS. 2-8.

The application causes a fabrication system to deposit a first set of stud bumps (protrusions) on a qubit chip (block 902). The application causes a fabrication system to deposit a second set of stud bumps (protrusions) on a substrate (block 904). The application causes a fabrication system to deposit a set of bumps on an interposer (block 906). For example, the application can cause a fabrication system to deposit a set of solder bumps on the interposer. The application causes a fabrication system to form an electrical connection between the qubit chip and an interposer (block 908). For example, the application can cause a fabrication system to cold weld an electrical connection between the stud bump on the qubit chip and a solder bump on the interposer. The application causes a fabrication system to form an electrical connection between the interposer and the substrate (block 910). For example, the application can cause a fabrication system to cold weld an electrical connection between the stud bump on the substrate and a solder bump on the interposer. The application causes a fabrication system to form an electrical connection between the qubit chip and the substrate (block 912). For example, the application can cause a fabrication system to cold weld an electrical connection between the stud bump on the qubit chip and a solder bump on the substrate. The application ends process 900 thereafter. These examples of process steps and order of process steps are not intended to be limiting. From this disclosure those of ordinary skill in the art will be able to conceive of many other steps and order of process steps suitable for quantum device assembly and the same are contemplated within the scope of the illustrative embodiments.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A quantum device comprising:
   a first set of protrusions formed on a substrate;
   a second set of protrusions formed on a qubit chip, the qubit chip being disposed in a recess of the substrate; and
   a set of bumps formed on an interposer, the set of bumps formed of a material having above a threshold ductility at a room temperature range;
   a first set of cold welded couplings between a first subset of the set of bumps and the first set of protrusions, the first set of cold welded couplings providing a first predetermined gap height between the interposer and the substrate; and a second set of cold welded couplings between a second subset of the set of bumps and the second set of protrusions, the second set of cold welded couplings providing a second predetermined gap height between the interposer and the qubit chip, the second predetermined gap height being less than the first predetermined gap height.

2. The quantum device of claim 1, wherein the first set of protrusions comprises Platinum.

3. The quantum device of claim 1, wherein the second set of protrusions comprises Platinum.

4. The quantum device of claim 1, wherein the set of bumps is of at least one member selected from a set comprising Indium, Tin, Lead, and Bismuth.

5. The quantum device of claim 1, wherein the first set of protrusions have a conical shape.

6. The quantum device of claim 1, wherein the second set of protrusions have a pyramid shape.

7. The quantum device of claim 1, wherein the set of bumps comprises a material exhibiting superconductivity in a cryogenic temperature range.

8. The quantum device of claim 1, wherein a plurality of the first set of protrusions are coupled via a cold welded coupling to one of the set of bumps.

9. The quantum device of claim 1, wherein the first set of protrusions comprises a gold coated superconducting material.

10. The quantum device of claim 1, wherein the second set of protrusions comprises a gold coated superconducting material.

11. The quantum device of claim 1, wherein the qubit chip is a quantum processor comprising a Josephson junction.

12. The quantum device of claim 1, wherein multiple cold welded couplings of the first set of cold welded couplings include multiple protrusions of the first set of protrusions such that the multiple protrusions have outer surface portions that are exposed.

13. The quantum device of claim 12, wherein the qubit chip is disposed between the substrate and the interposer.

14. The quantum device of claim 1, wherein the qubit chip is disposed between the substrate and the interposer.

* * * * *